Figure 1:
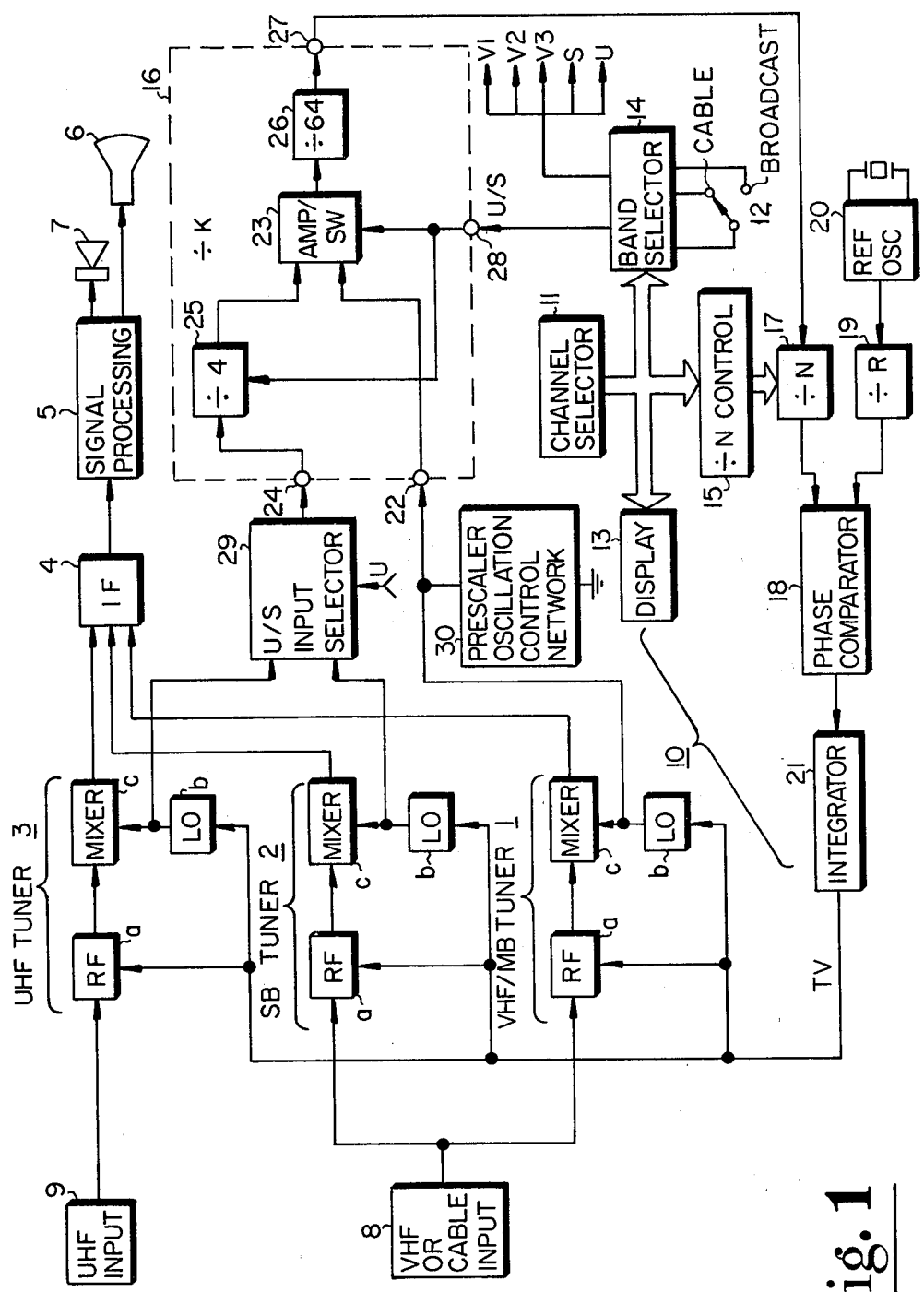

United States Patent [19]

Carlson et al.

[11] 4,368,540
[45] Jan. 11, 1983

[54] PHASE LOCKED LOOP TUNING SYSTEM INCLUDING A PRESCALER CONDITIONED TO OSCILLATE AT AN OUT-OF-BAND FREQUENCY

[75] Inventors: David J. Carlson; William L. Lehmann, both of Indianapolis, Ind.

[73] Assignee: RCA Corporation, New York, N.Y.

[21] Appl. No.: 271,742

[22] Filed: Jun. 5, 1981

[51] Int. Cl.³ ............................ H03L 7/18; H04B 1/26
[52] U.S. Cl. .................................... 455/180; 455/183; 455/260
[58] Field of Search ............... 455/165, 183, 180, 184, 455/75, 76, 77, 260, 265; 358/191.1

[56] References Cited

U.S. PATENT DOCUMENTS

| | | | |
|---|---|---|---|
| 4,110,693 | 8/1978 | Evans | 455/183 |
| 4,127,820 | 11/1978 | Beelitz et al. | 455/183 |
| 4,218,657 | 8/1980 | Rast | 455/183 |
| 4,245,350 | 1/1981 | Moore | 455/180 |
| 4,271,531 | 6/1981 | Torii et al. | 455/183 |

OTHER PUBLICATIONS

FIG. 19 on pp. 23-24 of "RCA Television Service Data for the CTC 111", file 1981, C-3.
"Data Sheet for the CA3163G" (RCA).

*Primary Examiner*—Marc E. Bookbinder
*Attorney, Agent, or Firm*—E. M. Whitacre; P. J. Rasmussen; P. M. Emanuel

[57] ABSTRACT

In a phase locked loop tuning system including a prescaler for dividing the frequency of the local oscillator signal by a factor selected to make the resultant frequency divided signal compatible with digital processing portions of the tuning system, a frequency selective network is coupled to the prescaler to tune the self-oscillation frequency of the prescaler to a frequency not corresponding to the local oscillator frequency of any legitimate channel. In this manner, when a new channel is selected and the amplitude of the local oscillator signal is below the threshold at which the prescaler will respond to it, the phase locked loop will properly control the local oscillator, rather than respond to a self-oscillation signal which may otherwise correspond to the local oscillator frequency for the selected channel.

9 Claims, 2 Drawing Figures

PHASE LOCKED LOOP TUNING SYSTEM INCLUDING A PRESCALER CONDITIONED TO OSCILLATE AT AN OUT-OF-BAND FREQUENCY

The present invention pertains to the field of tuning systems including a prescaler for dividing the frequency of the local oscillator signal by a factor selected to produce a divided frequency signal with a frequency suitable for processing in digital portions of the tuning system.

Phase locked loop (PLL) tuning systems are employed in television receivers since they can readily be digitally controlled and can produce local oscillator signals with extreme accuracy. Such PLL tuning systems include a source of reference frequency signals typically including a crystal oscillator, a fixed divider, commonly referred to as a prescaler, for dividing the frequency of a local oscillator signal to produce a frequency divided signal, a programmable divider for dividing the frequency divided signal by a programmable factor to produce a further frequency divided signal and a phase comparator for producing an error signal representing the phase and frequency deviation between the further frequency divided signal and the reference frequency signal. The error signal, which comprises pulses the width of which represents the magnitude of the deviation and the amplitude of which represents the sense of the deviation, is filtered to produce a tuning voltage for the local oscillator. The fixed factor is selected so that the frequency of the frequency divided signal can be processed by digital circuitry which comprises the remaining portion of the PLL tuning system. The programmable factor, commonly referred to as N, is set in accordance with the channel number of the selected channel. When the deviation between the further frequency divided signal and the reference frequency signal is at a predetermined small value, the loop is said to be locked. At this point, the frequency of the local oscillator signal is directly proportional to the frequency of the reference frequency signal by the programmable factor N.

The prescaler employed in such PLL tuning systems typically includes a high gain input amplifier arrangement to enhance the sensitivity of the prescaler. Such an amplifier arrangement can and typically does oscillate. This self-oscillation can occur at any frequency including that at or very near to the frequency of the frequency divided signal produced by the prescaler in response to the local oscillator signal for a preselected channel.

When a new channel is selected, the local oscillator may temporarily not oscillate or produce an output signal with a very low amplitude. Under such conditions, the divider stages of the prescaler may respond to the self-oscillation signal produced by the input amplifier arrangement rather than to the local oscillator signal. If the frequency of the self-oscillation signal is at or near the frequency of the local oscillator signal for the selected channel, the phase comparator will not detect an error although the local oscillator is not at the correct frequency. Accordingly, the tuning voltage will not be controlled to correct the frequency of the local oscillator signal. As a result, the tuning system will be locked in a mode in which the local oscillator frequency is incorrect.

In accordance with the present invention, in a digital tuning system including a prescaler, oscillation conditioning circuitry is coupled to the prescaler to condition it to self-oscillate at a frequency which does not correspond to any valid channel.

Figure 2:
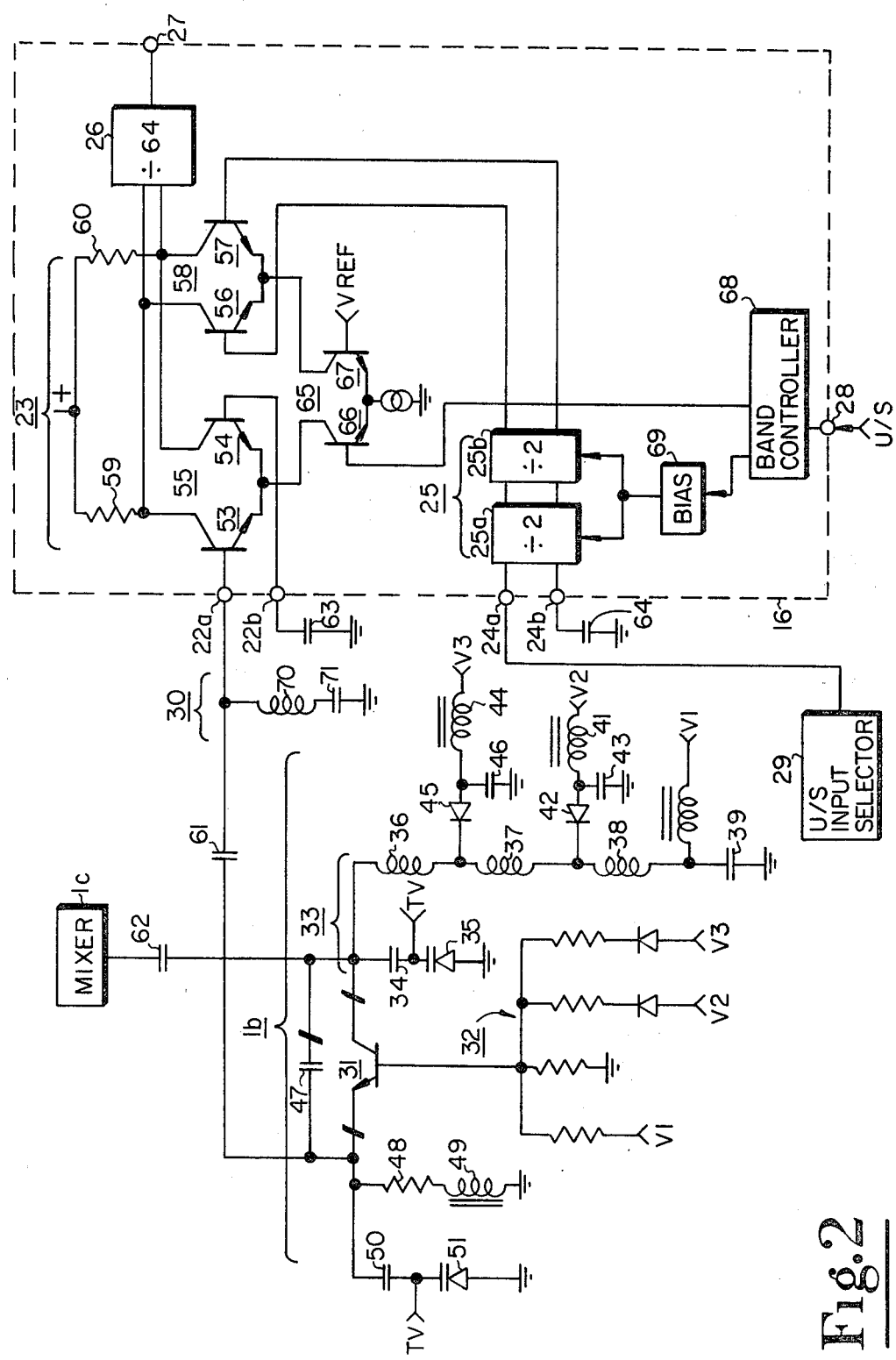

The invention will be described with reference to the accompanying Drawing in which:

FIG. 1 is a block diagram of a television receiver including a phase locked loop tuning system embodying the present invention; and FIG. 2 is a schematic diagram of a circuit implementation of a portion of the tuning system shown in FIG. 1 concerned specifically with the present invention.

The television receiver of FIG. 1 includes three tuners 1, 2 and 3 for heterodyning broadcast and cable RF carriers to produce an IF signal. The IF signal is processed by an IF section 4 to produce picture and sound components. A signal processing section 5 responds to the picture components to control a picture tube 6 to produce an image and to the sound components to control a speaker 7 to produce an audio response.

In the United States RF carriers heterodyned by tuners 1, 2 and 3 reside in the frequency bands indicated in the following table.

TABLE 1

| BAND | RF RANGE (MHz) | CHANNEL NUMBER | LO RANGE (MHz) |
|---|---|---|---|
| low VHF broadcast(LV) | 54–88 | 2-6 | 101–129 |
| midband cable (M) | 90–96 | (A − 5)-I | 137–215 |
| high VHF broadcast(HV) | 174–216 | 7-13 | 221–257 |
| super band cable (S) | 216–402 | J-(W + 17) | 263–443 |
| UHF broadcast (U) | 470–890 | 14-83 | 517–931 |

Tuner 1 heterodynes RF carriers in the VHF broadcast and midband cable bands. Tuner 2 heterodynes RF carriers in the super band cable bands. Tuner 3 RF carriers in the UHF broadcast band.

A VHF antenna network (not shown) or a cable installation (not shown) may be selectively connected to an input 8 which in turn is connected to tuner 1 and tuner 2. A UHF antenna network (not shown) may be connected to an input unit 9 which in turn is connected to tuner 3.

Each of tuners 1, 2 and 3 includes: an RF section "a" for selecting a particular RF carrier associated with a selected channel; a local oscillator (LO)"b" for generating a local oscillator signal having the appropriate frequency for heterodyning the selected RF carrier; and a mixer "c" for combining the selected RF carrier and local oscillator signal to produce an IF signal. Each RF section and local oscillator of each tuner includes a voltage controlled tuned circuit having its frequency response controlled in response to the magnitude of a tuning voltage (TV) generated by a phase locked loop (PLL) tuning system 10.

Channels are selected by a channel selector 11 including a calculator-like keyboard (not shown) which has keys for each of the decimal digits 0 through 9 and input logic (not shown) for generating first and second groups of BCD (binary coded decimal) signals representing the tens and units decimal digits of a channel number corresponding to a selected channel in response to the sequential depression of respective keys. From the above table it will be noted that the cable channels are identified by letters as well as numbers. A switch 12 is provided to enable the keyboard of channel selector 11 to be used to select cable channels as well as broadcast channels. When switch 12 is in the BROADCAST position, sequential operation of keys of channel selection unit 11 corresponding to the tens and units digit of a broadcast channel number causes the tuning of a respective broadcast carrier. When switch 12 is in the CABLE position, sequential operation of keys of channel selection unit 11 corresponding to the tens and units digit of a broadcast channel number causes the tuning of a respective cable carrier which has been assigned to the broadcast channel number, as indicated on a table supplied with the receiver.

The BCD signals generated by channel selection unit 11 are applied to a channel number display unit 13, a band selector 14 and a programmable divider control unit 15 of PLL tuning system 10. Band selector 14, which is also responsive to the position of switch 12, generates band selection signals representative of the band of the selected channel. V1, V2 and V3 band selection signals enable the operation of tuner 1. The reason that three band selection signals are used for tuner 1 is explained below in connection with FIG. 2. S and U band selection signals enable the operation of tuners 2 and 3, respectively. In addition, band selector unit 14 generates a U/S when the selected channel is in one of the U or S bands for the purpose described below. The connections between band selector 14 and tuners 1, 2 and 3 are not shown for the sake of clarity of the Drawing.

Phase-locked loop tuning system 10 includes a prescaler 16 for dividing the frequency of a local oscillator signal applied to it from one of tuners 1, 2 and 3 by a factor K sufficient to bring the frequency of the resultant signal within the operating range of a following digitally programmable counter serving as a programmable divider 17. Programmable divider 17 divides the frequency of the output signal of prescaler 16 by a factor N determined by control unit 15 in accordance with the channel number and band of the selected channel. A phase comparator 18 compares the phase and thereby the frequency of the output signal of programmable divider 17 with a reference frequency signal. The reference frequency is derived by a frequency divider ($\div R$)19 which divides the output signal of a crystal reference oscillator 20. Phase comparator 18 generates an error signal having pulses with widths and transition directions related to the magnitude and sense, respectively, of the deviation between the frequencies of the output signals of programmable divider 17 and reference frequency divider 19. An integrator 21 filters the error signal to produce the tuning voltage (TV) for tuners 1, 2 and 3.

After a channel has been selected, under normal operating conditions, the magnitude of tuning voltage is controlled in accordance with the error pulses until the frequency deviation between the two input signals of phase comparator 18 is negligibly small. At this point, the frequency, $f_{LO}$, of the local oscillator signal of the enabled one of tuners 1, 2 and 3 is related to the frequency, $f_{XTAL}$, of reference oscillator 20 by the equation:

$$f_{LO} = \frac{NK}{R} f_{XTAL}$$

If (K/R) $f_{XTAL}$ is chosen as 1 MHz, N will equal the frequency, in MHz, of the local oscillator signal. The frequency range of the local oscillator signal in each band is indicated in TABLE 1 above.

Since UHF and super band cable (SB) local oscillator frequencies are approximately four times higher than the VHF and midband cable (MB) local oscillator frequencies, prescaler 16 is arranged to selectively divide the frequency of the UHF and SB local oscillator signals by a factor four times higher than the factor employed for the VHF and MB local oscillator signal. For this purpose, prescaler 16 includes an input arrangement in which a V/M input terminal 22 for receiving VHF and MB local oscillator signals is directly coupled to a first input of a switch 23 and a U/S input terminal 24 for receiving UHF and SB local oscillator signals is coupled to a second input of switch 23 through a divide by 4 ($\div 4$) frequency divider 25. The output of switch 23 is coupled to the input of a common frequency divider 26 for dividing the frequency of its input signal by a common factor, e.g., 64. The output of divider 26 is coupled through an output terminal 27 to the input of $\div N$ divider 17. When a UHF or S channel is selected, in response to the U/S band selection signal generated by band selector 14, applied to a band control terminal 28, switch 23 couples the output signal of $\div 4$ frequency divider 25 to the input of $\div 64$ frequency divider 26. Otherwise, switch 23 couples the local oscillator signal provided at V/M input terminal 22 to $\div 64$ divider 26.

An integrated circuit high frequency counter suitable for use as prescaler 16 is available from RCA Solid State Division, Somerville, N.J. under commercial part numbers CA3136 and CA3179. Such a prescaler is described in U.S. Pat. No. 4,127,820 entitled "Electrical Circuit for Multiplexing and Dividing Different Bands or Frequencies" issued on Nov. 28, 1978 in the names of Beelitz and Preslar, hereby incorporated by reference. This type of prescaler has only a VHF input and a UHF input. This presents no problem with respect to the UHF and MB local oscillator signals since they are provided by a single local oscillator. However, since the UHF and SB local oscillator signals are provided by two respective local oscillators, a U/S input selector 29 is provided for coupling the UHF local oscillator signal generated by UHF tuner 3 to U/S input terminal 24 in response to a U band selection signal and for coupling the SB local oscillator signal generated by SB tuner 2 to U/S input terminal 24 in response to a S band selection signal. A suitable input selector is described in copending U.S. patent application Ser. No. 180,580, entitled "Input Selection Arrangement for Applying Different Local Oscillator Signals to a Prescaler of a Phase-Lock Loop Tuning System", filed on Aug. 25, 1980 in the name of Lehmann, and assigned like the present application to RCA Corporation.

To enhance the sensitivity of prescaler 16 to local oscillator signals, band switch 23 includes a high gain amplifier. Unfortunately, high gain amplifiers can and often do oscillate. The resultant self-oscillation signal can have any frequency including that corresponding to the frequency of a local oscillator signal for a selected channel. When a new channel is selected, the tuning voltage may be temporarily driven to a voltage at which the enabled local oscillator does not oscillate or oscillates to produce a local oscillator signal with a very small amplitude. Under these conditions, prescaler 16 may not respond to the local oscillator signal but rather to the self-oscillation signal. If the frequency of the selfoscillation signal is equal to or near that corresponding to the selected channel, the resultant frequency divided signal produced at the output of prescaler 16 will have substantially the same frequency as if the local oscillator were oscillating at the correct frequency. Thus, although the frequency of the local oscillator signal may be incorrect, the tuning voltage will not be controlled to correct it and the tuning system will remain locked at the incorrect frequency until a new channel is selected.

In the present tuning system, a prescaler oscillation control network 30 is coupled through V/M input terminal 22 to amplifier/band selector switch 23 to condition it to self-oscillate at a frequency which does not correspond to a valid channel, i.e., one that is not in any of the bands. Accordingly, when the enabled local oscillator produces a local oscillator signal with an amplitude below the threshold at which prescaler 16 can respond to it, the resultant frequency divided signal produced at the output of prescaler 16 will be ensured to be incorrect and PLL tuning system 10 will act to correct it.

The magnitude of the tuning voltage is directly related to the local oscillator frequency and the magnitude at which the local oscillator may not oscillate or produce an output signal with an amplitude below the threshold of prescaler 16 is low, e.g., approximately near zero volts. Accordingly, it is desirable that prescaler oscillation control network 30 condition prescaler 16 to oscillate at a frequency below the local oscillator frequency corresponding to the lowest valid channel, i.e., below 101 MHz, the local oscillator frequency corresponding to channel 2. In this manner, the error signal will indicate that the frequency of the local oscillator is too low and the tuning voltage will be increased to correspondingly increase the frequency of the local oscillator signal. This will also cause the local oscillator to begin to oscillate or to produce a higher amplitude output signal. As a result, the amplitude of the local oscillator signal will increase and eventually exceed the threshold of prescaler 16. Accordingly, prescaler 16 will respond to the local oscillator signal and PLL turning system 10 will operate in the normal manner to control the frequency of the local oscillator signal.

An implementation of prescaler oscillation control network 30 with reference to specific local oscillator and prescaler circuit configurations is shown in FIG. 2. Where reference to the same element as shown in FIG. 1 is made, the same reference number is used.

Local oscillator 1b of tuner 1 for generating the VHF and MB local oscillator signals comprises a modified Colpitts oscillator selectively operated in three bands in response to respective band selection signal V1, V2 and V3 since the frequency range of local oscillator 1b extends from below 101 MHz to above 257 MHz. The three bands are indicated by the following table:

TABLE 2

| BAND | CHANNEL IDENTIFICATION | LO RANGE (MHZ) |
| --- | --- | --- |
| V1 | 2-C | 101-179 |
| V2 | D-I | 185-215 |
| V3 | 7-13 | 221-257 |

Specifically, local oscillator 1b includes an NPN transistor 31 connected in a common base configuration. The base of transistor 31 is biased by a band selector network 32 comprising a resistive voltage divider selectively receiving positive voltages corresponding to band selection signals V1, V2 and V3. The elements in bias network 32 are selected so that transistor 31 has more gain in response to band selection signal V3 than in response to band selection signals V1 and V2.

A tuned circuit 33 is connected to the collector of transistor 31. Tuned circuit 33 is a parallel tuned circuit including capacitive reactive and inductive reactive branches. The capacitive branch includes a fixed capacitor 34 and a varactor diode 35, poled so as to be reverse biased in response to the application of a positive tuning voltage (TV) to its anode, connected in series between the collector of transistor 31 and ground. The inductive branch includes inductors 36, 37 and 38 and a bypass capacitor 39 connected in series between the collector of transistor 31 and ground. Bypass capacitor 39 is selected to provide negligible impedance in the VHF and MB bands. In response to the V1 band selection signal, coupled to the junction of inductor 38 and capacitor 39 through an RF choke inductor 40, operating voltage is applied to the collector of transistor 31 through the series combination of all three of inductors 36, 37 and 38. Accordingly, in response to the V1 band selection signal, all three of inductors 36, 37 and 38 are effectively included in tuned circuit 33. In response to the V2 band selection signal, applied through an RF choke inductor 41 selected to have a very high impedance in the VHF and MB bands, operating voltage is applied to the collector of transistor 31. In addition, a switching diode 42 is forward biased and thereby rendered conductive so that a bypass capacitor 43 is connected between the junction of inductors 37 and 38 and ground. Accordingly, in response to the V2 band selection signal, only inductors 36 and 37 are effectively included in tuned circuit 33. In a similar arrangement to that of inductor 41, diode 42 and capacitor 43, an inductor 44, a switching diode 45 and a bypass capacitor 46 are included in tuned circuit 33 to effectively include only inductor 36 in tuned circuit 33 in response to the V3 band selection signal.

A feedback capacitor 47 is connected between the collector and emitter electrodes of transistor 31.

A bias path comprising a resistor 48 and a RF choke inductor 49 is connected in series between the emitter of transistor 31 and ground.

To extend the lower end of the frequency range of local oscillator 1b a capacitive network comprising a fixed capacitor 50 and a varactor diode 51, poled to be reverse biased in response to the tuning voltage, is connected in series between the emitter of transistor 31 and ground. This type frequency range extending network is described in detail in U.S. patent application Ser. No. 119,991, entitled "Controlled Local Oscillator with Apparatus for Extending its Frequency Range", filed Feb. 8, 1980, in the name of Carter and assigned to the same assignee as the present application.

As earlier noted, the CA3136 and CA3179 integrated circuits commercially available from RCA Corporation are suitable for use as prescaler 16. Those types of integrated circuit include arrangements which are intended to be driven differentially, i.e., by two out-of-phase input signals, since such arrangements are more sensitive and noise immune than single-ended arrangements, i.e., those receiving a single input signal referenced to a reference potential such as ground. Accordingly, although prescaler 16 is shown in FIG. 1 as having one input terminal for each of the VHF and MB local oscillator signals and the UHF and SB local oscillator signals, in actuality prescaler 16 includes two input terminals 22a and 22b for the VHF and MB local oscillator signals and two input terminals 24a and 24b for the UHF and SB local oscillator signals. Each pair of input terminals is intended to receive differential local oscillator signals. Although prescaler 16 is intended to be driven differentially, it is driven with a single single-ended input signal since it has been found that this results in acceptable performance while obviating the need for generating and applying two out-of-phase local oscillator signals.

Specifically, amplifier/switch 23 includes a first pair of NPN transistors 53 and 54 connected in a first differential amplifier configuration 55 and a second pair of NPN transistors 56 and 57 connected in a second differential amplifier configuration 58. The collectors of transistors 53 and 56 are connected at a first output point to a common load resistor 59 and the collectors of transistors 54 and 57 are connected at a second output point to a common load resistor 60. A first output of local oscillator 1b at the emitter of transistor 31 is coupled through a d.c. blocking capacitor 61 having a negligible impedance in the frequency range of local oscillator 1b through an input terminal 22a to the base of transistor 53. (A second output of local oscillator 1b at the collector of transistor 31 is connected to an input of mixer 1c through a d.c. blocking capacitor 62.) The base of transistor 54 is connected through input terminal 22b and a bypass capacitor 63 to ground. The latter configuration causes differential amplifier 55 to be operated in a single-ended configuration.

Divider 25 includes two cascaded emitter coupled logic (ECL) master slave flip-flops 25a and 25b each of which is intended to be driven by two out-of-phase input clock signals. However, the output of input selector 29 is connected to input terminal 24a and input terminal 24b is connected to ground through a bypass capacitor 64 so that flip-flop 25a receives a single-ended input signal to effect a single-ended input configuration. The out-of-phase output signals of flip-flop 25a are coupled to respective inputs of flip-flop 25b. The out-of-phase output signals of flip-flop 25b are coupled to respective bases of transistors 56 and 57.

A current steering network 65 comprising NPN transistors 66 and 67 connected in a differential configuration selectively supplies operating current to one of differential amplifiers 55 and 58. When current is supplied to differential amplifier 55 and removed from differential amplifier 58 the VHF and MB local oscillator signals provided at terminal 22a are amplified by differential amplifier 55 and differential output signals are developed at the collectors of transistors 53 and 54. The differential output signals are coupled to divider 26 which also comprises cascaded ECL master-slave flip-flops. When current is supplied to differential amplifier 58, the UHF and SB local oscillator signals, after frequency division by divider 25, are amplified by differential amplifier 58 and the resulting differential output signals are applied to divider 26.

To control the above-described current steering, a band controller 68, in response to the U/S band selection signal, applies a voltage to the base of transistor 66 which is smaller than a reference voltage (VREF) applied to the base of transistor 67 and otherwise applies a voltage to the base of transistor 66 which is larger than VREF. Accordingly, transistor 67 is conductive and transistor 66 is non-conductive when the U/S band selection signal is present and transistor 66 is conductive and transistor 67 is non-conductive when the U/S band selection signal is absent. In addition, to minimize interference from spurious signals, band controller 68 only causes a bias supply 69 to supply bias voltage to divider 25 in response to the U/S band selection signal.

As discussed above, due to the high gain of differential amplifier 55 and the presence of parasitic feedback components, amplifier 55 can and is likely to oscillate. It has been found that differential amplifier 55 may oscillate at a frequency corresponding approximately to that of the local oscillator frequency for channel 13, i.e., 256 MHz, and that as the operating temperature increases, the self-oscillation frequency decreases and at any given time may correspond to local oscillator frequency for channel 12, 11 or 10. As a result, when these channels are selected, the "lock-up" problem described above may be encountered.

To overcome this problem it has been found that placing a relatively high value inductor 70 (e.g., in the order of 0.7 microhenries) in shunt with input terminal 22a is effective to tune the self-oscillation frequency of differential amplifier 55. As earlier indicated, it is desirable that inductor 70 is selected so that the selfoscillation frequency is below the lowest legitimate local oscillator frequency, i.e., that corresponding to channel 2. A d.c. blocking capacitor 71, having negligible impedance in the frequency range of local oscillator 1b, is connected in series with inductor 70 to prevent inductor 70 from affecting the d.c. operating conditions at the base of transistor 53. While a relatively high value inductor tunes the self-oscillation frequency of differential amplifier 55, it acts as a RF choke with respect to local oscillator signals produced by local oscillator 1b and thereby does not significantly affect the operation of local oscillator 1b.

While other reactive components may be employed to tune the self-oscillation frequency of prescalers with other input configurations, it was found that with the prescaler arrangement shown in FIG. 2, which appears to exhibit a capacitive reactance at input terminals 22a and 22b, an inductor was found more desirable for tuning the circuitry of self-oscillation than resistive or capacitive elements. A capacitor was found to be relatively ineffectual to tune the self-oscillation frequency of amplifier 55 and it adversely attenuated the local oscillator signal coupled to terminal 22a. A resistor similarly was ineffectual to tune the self-oscillation frequency and it adversely affected the amplitude of the local oscillator signal.

As earlier noted the self-oscillation problem of prescaler 16 is manifested when the enabled local oscillator fails to oscillate or oscillates with a low amplitude output signal. As was earlier explained, this occurs when the tuning voltage is driven low when a new channel is selected and particularly when the newly selected channel is in a new band. It is possible to arrange oscillator 1b so that it continues to oscillate and oscillates with a sufficiently high amplitude output signal at relatively low tuning voltage magnitudes, e.g., near 0 volts. However, such a solution is undesirable since at relatively low tuning voltages, varactor diodes tend to exhibit excessive losses manifested mathematically by a low Q figure of merit. While this problem can be compensated by circuit design, it is difficult to accomplish this in a local oscillator, such as local oscillator 1b, which is arranged to oscillate in three bands which extend over a relatively large frequency range because of the interrelations of various components. Accordingly, a prescaler oscillation control network 30 which preconditions prescaler 16 to oscillate at an out-of-band frequency is particularly desirable in an arrangement which utilizes a multiband local oscillator arrangement such as that of local oscillator 1b.

While the present invention is particularly of interest in connection with self-oscillations that occur at or near local oscillator frequencies for the VHF and midband cable bands, similar arrangement can be employed in association with the UHF and superband cable bands. However, it has been found that the uncontrolled selfoscillations of prescaler 16 tend not to occur at frequencies corresponding to UHF and SB local oscillator frequencies. Accordingly, a structure similar to that prescaler oscillation control network 30 was not found necessary at U/S input terminal 24a. Nevertheless, it is noted that by placing prescaler oscillation control network 30 at the input to amplifier/switch 23 and by selecting the controlled oscillation of prescaler 16 to be below channel 2, prescaler 16 will produce an output signal in response to the self-oscillation signal which is not in any band of interest.

The following table specifies, by way of example, certain component types and values that may be employed in the circuits of FIG. 2.

TABLE 3

| COMPONENT | VALUE |
|---|---|
| V1, V2 and V3 | +18 volts |
| capacitor 34 | 240 picofarads (pf) |
| varactor diode 35 | BB329 available from ITT |
| inductor 36 | approximately 58 nanohenries (nh) |
| inductor 37 | approximately 70 nh |
| inductor 38 | approximately 96 nh |
| capacitor 39 | 68 pf |
| inductor 40 | 10 microhenries (mh) |
| inductor 41 | 10 mh |
| capacitor 43 | 5.6 pf |
| inductor 44 | 10 mh |
| capacitor 46 | 3.3 pf |
| capacitor 47 | 4.7 pf |
| resistor 48 | 1000 ohms |
| inductor 49 | 10 mh |
| capacitor 50 | 6.8 pf |
| varactor diode 51 | BB329 |
| resistor 59 | 600 ohms |
| resistor 60 | 600 ohms |
| capacitor 61 | 0.82 pf |
| capacitor 62 | 3.3 pf |
| capacitor 63 | 1 pf |
| capacitor 64 | 470 pf |
| inductor 70 | 0.7 mh |
| capacitor 71 | 1000 pf |

In addition, certain ferrite beads, which introduce loss, may be included in the circuit locations indicated by the black rectangles to prevent undesired resonances.

As noted from TABLE 3, input bypass capacitor 63 has a much smaller value than bypass capacitor 64 to ensure that amplifier 55 will oscillate at the frequency controlled by inductor 70. It has been found that the value of input bypass capacitor 63 is too large, e.g., equal to the value of bypass capacitor 64, the desired self-oscillation frequency will not be achieved.

In addition, while the single-ended operation described above may be accomplished merely by using a single input signal, input bypass capacitors 63 and 64 are desirable to enhance the common mode rejection capability of the differential input arrangements of prescaler 16. However, it has been found that input bypass capacitor 63 may be omitted, if desired to reduce cost, when self-oscillation control network 30 is used with substantially the same performance.

Since the frequency of RF carriers provided by cable systems may not be precise, apparatus for adjusting the local oscillator may be added to phase lock loop tuning system 10. Apparatus for this purpose, which selectively applies an automatic fine tuning (AFT) signal derived from a conventional AFT discriminator included in IF section 4 to the enabled local oscillator after the PLL tuning system 10 has achieved lock, is described in U.S. Pat. No. 4,031,549, issued in the name of Rast et al. on June 21, 1977.

While prescaler oscillation control network 30 is shown as being connected through input terminal 22a to one input of differential amplifier 55, it may instead be connected through input terminal 22b to the other input of differential amplifier 55 in place of bypass capacitor 63. This would help isolate local oscillator 1b from any possible loading by network 30. These and other modifications are intended to be within the scope of the present invention as defined by the following claims.

What is claimed is:

1. In a tuning system for tuning a receiver to a selected one of a plurality of channels in a predetermined range of frequencies, apparatus comprising:
   local oscillator means for generating a local oscillator signal and controlling its frequency in response to the magnitude of a tuning signal;
   prescaler means for dividing the frequency of said local oscillator signal by a predetermined factor to generate a frequency divided signal;
   control means responsive to said frequency divided signal for generating said tuning signal and controlling its magnitude until said frequency divided signal has a predetermined frequency corresponding to a selected channel;
   said prescaler means being susceptible of self-oscillation at a self-oscillation frequency and thereby generating a frequency divided signal having a frequency corresponding to that of one of said channels when said local oscillator signal has an amplitude below a predetermined threshold;
   frequency selective means coupled to said prescaler means for tuning said self-oscillation frequency to a predetermined frequency such that said frequency of said frequency divided signal produced in response to said self-oscillation does not correspond to that produced in response to the local oscillator frequency of any channel in said range.

2. The apparatus recited in claim 1 wherein:
   said local oscillator means controls the frequency of said local oscillator signal in direct relationship to the magnitude of said tuning signal and the amplitude of said local oscillator signal also exhibits a direct relationship to the magnitude of said tuning signal;
   said frequency selective means tunes said selfoscillation frequency such that said frequency of said frequency divided signal produced in response to said selfoscillation corresponds to that produced in response to a signal having a frequency below that of the local oscillator signal for the lowest channel in said range.

3. The apparatus recited in claim 1 wherein
   said local oscillator means includes a first local oscillator for generating a first local oscillator signal associated with a first group of channels in a first band of frequencies in said range and controlling its frequency in response to the magnitude of said tuning signal and a second local oscillator for generating a second local oscillator signal associated with a second group of channels in a second band of frequencies in said range and controlling its frequency in response to the magnitude of said tuning signal;

said prescaler means includes an amplifier having a first input coupled to receive said first local oscillator signal, a second input and an output; said amplifier being susceptible of self-oscillation at a self-oscillation frequency corresponding to a channel in one of said first and second bands; a first frequency divider having an input coupled to the output of said amplifier and an output at which said frequency divided signal is developed; a second frequency divider having an input coupled to receive said second local oscillator signal and an output at which a second frequency divided signal is generated in response to said second local oscillator signal and which is coupled to the second input of said amplifier; and switching means coupled to said amplifier for causing said amplifier to amplify said first local oscillator signal and to supply the amplified first local oscillator signal to its output in response to a first band selection signal and for causing said amplifier to amplify said second frequency divided signal and to supply the amplified second frequency divided signal to its output in response to a second band selection signal;

said control means includes band selection means for generating said first band selection signal when the selected channel is in said first band and for generating said second band selection signal when said selected channel is in said second band; and said frequency selection means is coupled to said amplifier for tuning said self-oscillation frequency of said amplifier such that said frequency of said frequency divided signal produced by said first frequency divider in response to said self-oscillation does not correspond to that produced in response to the local oscillator signal of any channel in said first and second bands.

4. The apparatus recited in claim 3 wherein:

said prescaler means is incorporated in an integrated circuit having an input terminal to which said first input of said amplifier is connected; and said frequency selective means is coupled to said first input terminal of said integrated circuit.

5. The apparatus recited in claim 4 wherein:

said amplifier comprises a differential amplifier; and said frequency selective means includes an inductor connected between said input terminal and a circuit point at which a signal reference potential is developed.

6. The apparatus recited in claim 5 wherein:

said inductor is connected in series with a capacitor.

7. The apparatus recited in claims 3 or 6 wherein:

each of said first and second local oscillators controls the frequency of its respective said local oscillator signal in direct relationship to the magnitude of said tuning signal and the amplitude of said respective local oscillator signal also exhibits a direct relationship to the magnitude of said tuning signal; and said frequency selective means tunes said selfoscillation frequency to be equal to a frequency below the local oscillator frequency for the lowest channel in said first band.

8. The apparatus recited in claim 1 wherein:

said prescaler means comprises an integrated circuit having first and second input terminals and an output terminal and including a differential amplifier having first and second inputs connected to respective ones of said first and second input terminals and an output; one of said first and second input terminals being coupled to receive said local oscillator signal; and a frequency divider having an input coupled for receiving the signal developed at the output of said differential amplifier and an output at which said frequency divided signal is developed and which is connected to said output terminal; and said frequency selective means is connected to one of said first and second input terminals of said integrated circuit.

9. The apparatus recited in claim 8 wherein:

said frequency selective means includes an inductor connected in series with a capacitor between said one of said input terminals to which said frequency selective means is connected and a circuit point at which a signal reference potential is developed.

* * * * *